RADIO RECEIVER IN WHICH SIGNAL TUNED CIRCUITS ARE CONTROLLED BY REMOTELY TUNED LOCAL OSCILLATOR

Filed July 15, 1954

INVENTOR.
WILLIAM R. SMITH-VANIZ, JR.
BY
CURTIS, MORRIS & SAFFORD.
ATTORNEYS

Oct. 6, 1959 W. R. SMITH-VANIZ, JR 2,907,876

RADIO RECEIVER IN WHICH SIGNAL TUNED CIRCUITS ARE CONTROLLED BY REMOTELY TUNED LOCAL OSCILLATOR

Filed July 15, 1954 2 Sheets-Sheet 2

INVENTOR.
WILLIAM R. SMITH-VANIZ, JR.
BY
CURTIS, MORRIS & SAFFORD.
ATTORNEYS 2,907,876
Patented Oct. 6, 1959

2,907,876

RADIO RECEIVER IN WHICH SIGNAL TUNED CIRCUITS ARE CONTROLLED BY REMOTELY TUNED LOCAL OSCILLATOR

William R. Smith-Vaniz, Jr., Norwalk, Conn. assignor to C.G.S. Laboratories, Inc., Stamford, Conn.

Application July 15, 1954, Serial No. 443,488

9 Claims. (Cl. 250—20)

This invention relates to radio receivers and in particular to radio receivers in which at least part of the circuits are tuned electrically without mechanically moving parts.

The invention is described as embodied in a radio receiver adaptable for use as an automobile receiver or in other applications where remote control of the receiver is desirable and particularly where it is not feasible to provide mechanical coupling between the tuning portion of the receiver and the operating circuits. For example, with such an arrangement a small tuning unit may be positioned adjacent the driver's position in the automobile and the remainder of the receiver located in some other portion of the automobile; for example, in the trunk where there is adequate space for the receiver and it is easily serviced.

In order to tune a radio receiver, it is necessary to adjust the resonant frequency of two or more circuits to the frequency of the radio station to be received. In most radio receivers these circuits are tuned by mechanically changing the value of inductors or capacitors, each forming part of one of the tuned circuits. In some receivers, switch contacts operated by push-buttons substitute different sets of pre-tuned circuits for each station to be received. This manner of tuning, however, is impractical where the main portion of the receiver is to be positioned remotely from the tuning controls.

The resonant frequency of such tuned circuits, however, can be varied without moving parts by making use of controllable inductors. Such controllable inductors usually comprise a core of ferrite, or other suitable ferro-magnetic material, which carries a control winding and one or more signal windings. By varying the magnitude of a direct-current through the control winding, the effective inductance of the signal winding on the core changes in inverse relationship with the degree of magnetic saturation of the core.

However, unless special precautions are taken, such controllable inductors are sensitive to changes in the ambient temperature, and the effective inductance of the signal winding is not directly related to the magnitude of the control current because of the hysteresis of the core material. The present invention provides an arrangement making use of such controllable inductors for tuning a radio receiver and for eliminating the adverse effects of changes caused by hysteresis and temperature coefficient of the core material.

Moreover, if the receiver is subjected to conditions of use when there is likely to be substantial variation in the supply voltage, the circuit for providing the control current for the controllable inductor must be stabilized so that the resonant frequency of the tuned circuits is not shifted excessively by such changes in supply voltage. These stabilizing arrangements must be particularly effective if the local oscillator is controlled by the controllable inductor because relatively small changes in the oscillator frequency will detract from the quality of the received signals. The resonant circuits, however, in the radio frequency portions of the receiver can be de-tuned to a considerably greater extent without appreciable effect on the quality of the received signals. The present invention provides an arrangement in which the local oscillator is not under the control of a controllable inductor, thereby providing maximum frequency stability, and the remaining tuned circuits are electrically controlled to follow or "track" with the oscillator frequency.

The various aspects, advantages, and objects of the invention will be further understood from consideration of the following description of a radio receiver incorporating the present invention considered in conjunction with the accompanying drawings, in which.

Figure 1:
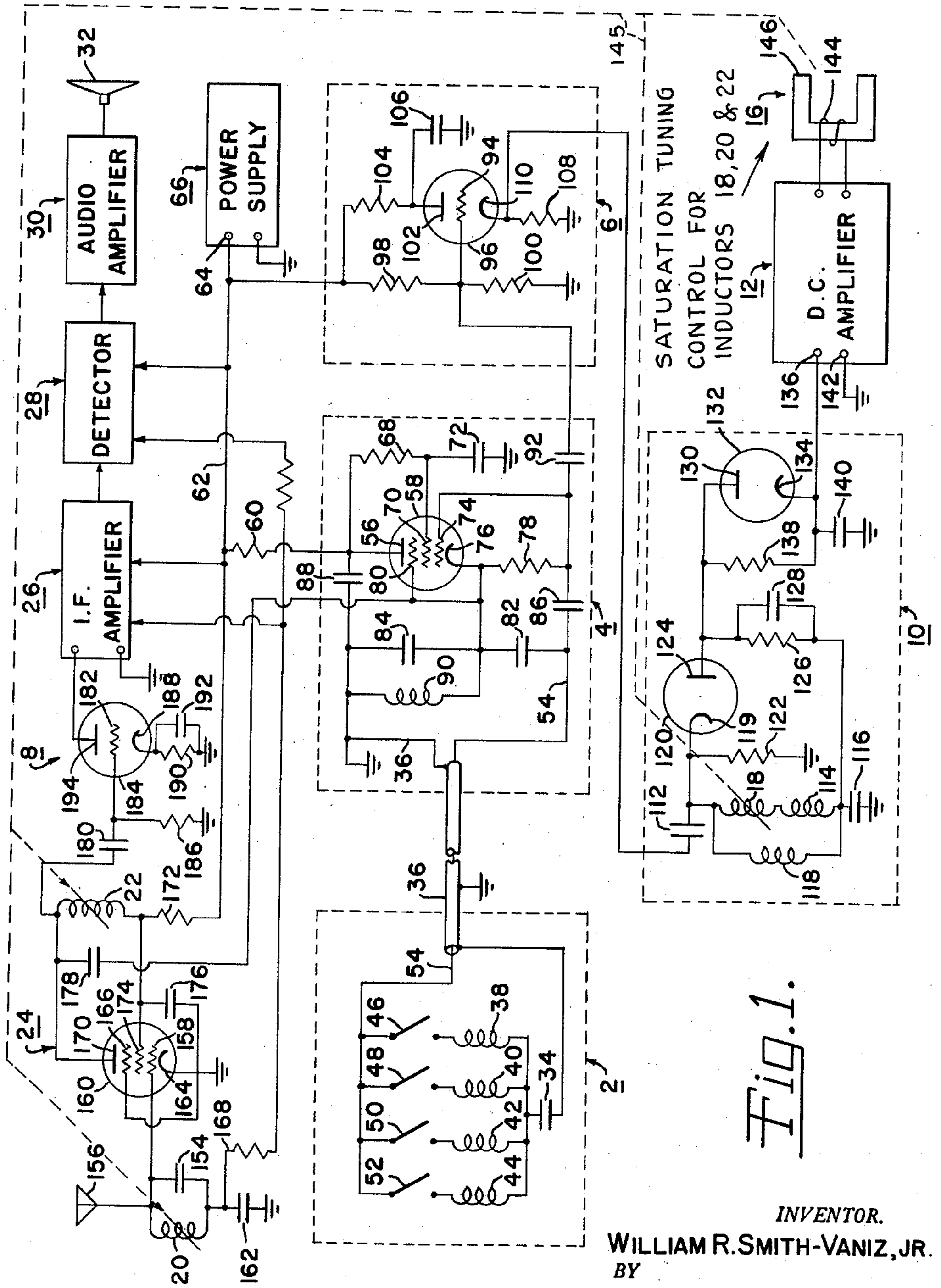
Figure 1 is a schematic and diagrammatic representation of a radio receiver incorporating the invention.
Figure 4:
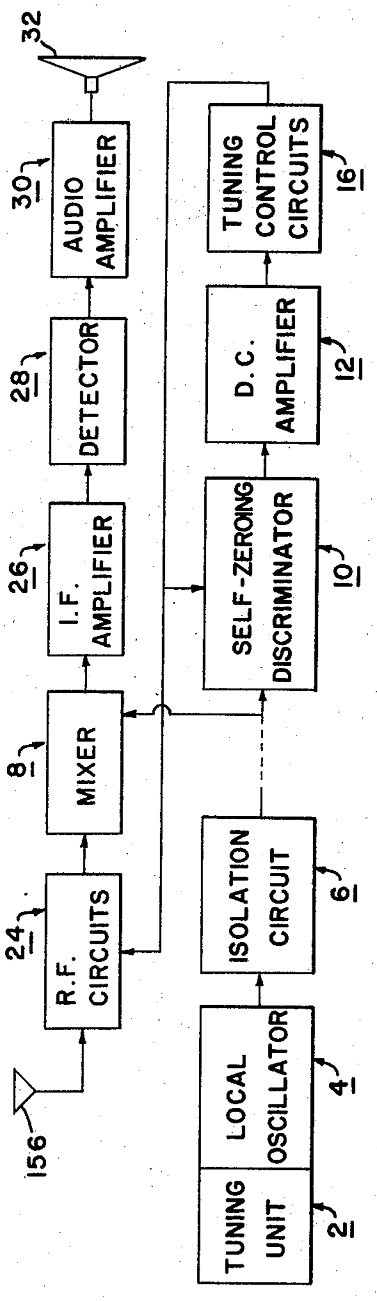
Figure 4 shows a receiver similar to the one described in Figure 1 and in which the local oscillator is positioned remotely from the remainder of the receiver.

In brief, the operation of the receivers illustrated by Figures 1 and 4 is as follows. A tuning unit 2 for the receiver is positioned remotely from the remainder of the receiver and is arranged to control the frequency of an oscillator 4. In the circuit shown in Figure 4 in which the local oscillator 4 is shown as positioned remotely from the remainder of the receiver, the signal from the oscillator 4 is coupled through an isolation stage 6, which in this example is a cathode follower, to the mixer stage 8 of the receiver. In the circuit shown in Figure 1, the signal from the oscillator 4 is coupled through a condenser 178 to the mixer stage, as explained hereinafter.

The oscillator signal from the isolation stage 6 is coupled also to a discriminator circuit 10, which delivers a D.-C. control signal that is fed to a D.-C. amplifier 12. This discriminator circuit is tunable and arranged to assume automatically a balanced condition with zero output voltage: it is therefore referred to as a self-zeroing discriminator.

Figure 2:
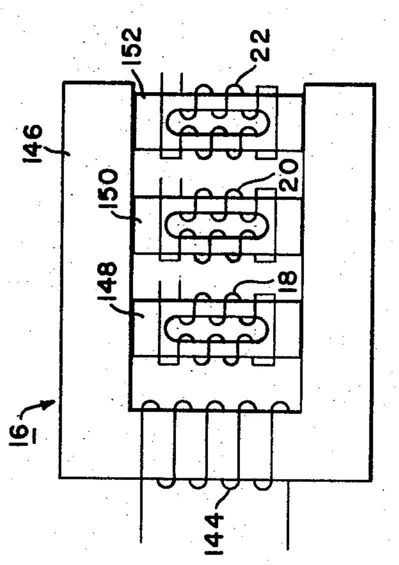
Figure 2 represents diagrammatically a controllable inductor suitable for use in the circuit of Figure 1.

The control signal from the discriminator circuit 10 is amplified by the amplifier 12 and is applied to a controllable inductor 16 such as the one illustrated diagrammatically in Figure 2. This controllable inductor is arranged to control the inductance of three signal windings 18, 20, and 22. One of these windings 18 forms part of the frequency selective network of the discriminator 10 and is arranged to so control the frequency response of the discriminator circuit 10, as to maintain the control voltage which is fed from the discriminator to the D.-C. amplifier 12 at nearly zero value. Thus, the inductance of the signal winding 18 is caused to change in accordance with changes in the frequency of the oscillator so that the tuning of the discriminator follows closely the frequency of the signal produced by the oscillator 4.

The signal winding 20 which is in the antenna circuit of the receiver, and the signal winding 22, in the anode circuit of the R-F amplifier stage 24 of the receiver, are arranged to be controlled by the same control signal that controls the inductance value of the winding 18. Accordingly, the inductance value of the two signal windings 20 and 22, each of which forms part of a tuned circuit, is made to follow the changes in the oscillator frequency. The remainder of the receiver, including an intermediate frequency amplifier 26, a detector 28, an audio amplifier 30, and a loud-speaker 32, is conventional in construction and is shown in block form.

The tuning unit 2 includes a fixed capacitor 34, one terminal of which is connected to the grounded outer shield 36 of a cable 37 that connects the tuning unit 2 to the oscillator 4. The other terminal of this fixed capacitor 34 is connected to one end of each of four fixed inductors 38, 40, 42, and 44, the opposite end of each of which is connected through one of the switches 46, 48, 50, and 52 to a lead 54 which is connected through the cable shield 36 to the oscillator circuit 4.

The inductors 38 to 44 have different values of inductance selected so that the closing of any one of the switches 46 to 52 tunes the oscillator 4 for reception of a particular station.

The oscillator 4 is generally similar by one described by Clapp in the March 1948 issue of "The Proceedings of the Institute of Radio Engineers" at pages 356 to 358. In this example, however, the oscillator has been changed by positioning the series inductance-capacitance circuit at a position remote from the remainder of the oscillator circuit. This particular circuit under these conditions has the advantage of a very high degree of stability and changes in the capacitance of the cable 36 and the like have very little effect upon the frequency of the signal generated by the oscillator. Moreover, the circuit is highly stable with respect to changes in the supply voltage and is very little affected by slight changes in the characteristics of the other components of the circuit other than the components of the tuning unit 2.

The oscillator 4 is a grounded plate arrangement and no high D.-C. voltages appear on the cable 36 or in the tuning unit 2. The anode 56 of the oscillator tube 58 is connected through a resistor 60 to a positive voltage supply lead 62 which is connected to a positive output terminal 64 of a conventional-type power supply 66. The power supply 66 may be a conventional rectifier-filter power supply operated from ordinary alternating current power mains or it may be a conventional-type power supply such as is ordinarily used in automobile radios including, for example, a vibrating-type chopper, a transformer, and the usual rectifier and filter components. This power supply is also arranged to supply the usual heater currents for the tubes used in the receiver: these heaters and the connections have been omitted from the drawings in order to simplify the drawings and description.

The anode 56 of the tube 58 is connected through a resistor 68 to the screen grid 70 of the tube 58 which is by-passed to ground through a capacitor 72. The control grid 74 of this tube is returned to the cathode 76 through a fixed resistor 78. The suppressor grid 80 is connected directly to the cathode 76.

Two coupling capacitors 82 and 84 are connected respectively between the cathode 76 and the two leads 36 and 54 which go to the tuning unit 2. The tuning unit lead 54 is coupled also through a capacitor 86 to the control grid 74 of the tube 58, and the grounded shield lead 36 is coupled through a capacitor 88 to the anode 56. An R-F choke 90, which preferably has a capacitive reactance at the frequency of operation of the oscillator, is connected in parallel with the coupling capacitor 84 to provide a D.-C. return circuit for the cathode 76.

The coupling capacitors 82 and 84 are large in value in comparison with the fixed capacitor 34 in the tuning unit and are extremely large with respect to the interelectrode capacitances of the tube 58.

In this example, the frequency of the signal generated by the oscillator 4 depends upon which of the switches 46, 48, 50 or 52 is closed, these switches being of the type that ordinarily are operated by a push-button arrangement. It will be apparent that any desired tuning mechanism can be employed: for example, one in which the value of either the inductance or the capacitance is varied either continuously or in predetermined steps. If desired, a single inductor can be used in the tuning unit and a number of capacitors of different sizes arranged so that any one of the capacitors can be substituted in the circuit for the capacitor 34. If desired, a separate capacitor can be connected in series with each of the inductors and arranged so that the switch substitutes any one of these capacitor-inductor circuits into the oscillator circuit. In any event the tuner 2 is arranged to control the operating frequency of the local oscillator 4.

The signal produced by the local oscillator 4 is coupled through a capacitor 92 to the control grid 94 of a triode tube 96 which is connected in a cathode-follower circuit. Bias voltage is provided for the grid 94 by means of a voltage divider consisting of two fixed resistors 98 and 100 connected in series between the positive-voltage supply lead 62 and the common ground circuit, the grid 94 being connected to the junction of these resistors. The anode 102 of this tube is connected through a resistor 104 to the lead 62 and is by-passed to ground through a capacitor 106. A cathode load resistor 108 is connected between the cathode 110 of this tube and the common ground circuit. Tht output signal is taken from the cathode 110 and is coupled through a capacitor 112 to the self-zeroing discriminator circuit 10.

One terminal of the capacitor 112 is connected through the controllable inductor signal winding 18, a fixed padding inductor 114, and a fixed capacitor 116 to ground. A second padding inductor 118 is connected in parallel with the series combination of the winding 18, a fixed padding inductor 114, and a fixed capacitor 116 to ground. A second padding inductor 118 is connected in parallel with the series combination of the winding 18 and the padding inductor 114. The reason for the padding inductors 114 and 118 will be explained later, and for the purposes of the present explanation these padding inductors can be considered together with the signal winding 18 as forming a single inductor, the value of which can be controlled electrically.

The cathode 119 of a half-wave rectifier tube 120 is connected to the junction of the coupling capacitor 112 and the signal winding 18. A D.-C. ground return is provided by means of a high-value resistor 122 connected between the cathode 119 and ground. The anode 124 of the diode tube 120 is connected through a load resistor 126 to the junction of the padding inductor 114 and the fixed capacitor 116. A filter capacitor 128 is connected in parallel with the load resistor 126. The anode 124 of the tube 120 is connected also to the anode 130 of another half-wave rectifier tube 132, the cathode 134 of which is connected to an input terminal 136 of the D.-C. amplifier 12. A load resistor 138 is connected between the anode 130 and the cathode 134 of the tube 132, and the cathode 134 is by-passed to ground through a fixed capacitor 140.

The operation of this discriminator circuit 10 is as follows: The voltage appearing across the inductive portion of the frequency-sensitive network is rectified by the tube 120 and appears across the load resistor 126. With this arrangement a negative voltage appears at the anode 124 of the tube 120 which is equal to the peak voltage developed across the inductive portion of the frequency-sensitive network.

The voltage appearing across the capacitor 116, which forms the capacitive portion of the frequency-sensitive network, is rectified by the tube 132. It will be noted that the R-F potential appearing at the junction of the capacitor 116 and the padding inductor 114 is coupled through the filter capacitor 128 to the anode 130 of the tube 132. The cathode 134 of this tube is maintained at R-F ground potential by means of the capacitor 140. With the arrangement shown, a voltage is developed across the resistor 138, negative at its upper end with respect to ground, that is equal to the peak voltage appearing across the capacitor 116. Thus, the voltage appearing at the input terminal 136 of the D.-C. amplifier 12 with respect to the grounded input terminal 142 of this amplifier is equal to the difference between the voltage developed across the inductive portion of the frequency-sensitive network, and that developed across the capacitor 116.

If the frequency of the signal which is applied through the capacitor 112 to the discriminator circuit 10 is equal to the series resonant frequency of the inductive portion of the network (comprising the signal winding 18, the padding inductor 114, and the parallel padding inductor 118) and the capacitor 116, the voltage developed across the inductive portion of this network will be equal to the voltage developed across the capacitor 116 and no voltage will be applied to the input terminal 136 of the amplifier 12. However, if a signal of any other frequency is applied to this network, a D.-C. control voltage will be developed at the terminal 136, the polarity of which will depend on whether the applied frequency is above or below the resonant frequency of the frequency-sensitive network. The signal voltage appearing at the input terminal 136 is amplified by the amplifier 12 and is applied to the control winding 144 of the controllable inductor 16. This control winding 144 controls the inductances of the three windings 18, 20, and 22, as indicated by the dashed line 145 and arrowheads directed toward these three windings.

The operation of the controllable inductor will be best understood by the reference to the diagrammatic illustration of Figure 2. The controllable inductor includes a yoke or core portion 146 which may be formed of laminated or powdered iron or other suitable ferro-magnetic material and which carries the control winding 144. Three or more signal core portions 148, 150, and 152 are connected across the opposing arms of the yoke 146. The core portions 148, 150, and 152 are formed of ferrite material, for example, of the general type described by Snoeck in U.S. Patents 2,452,529, 2,452,530, and 2,452,531. Such ferrite materials are formed of a mixture of metal oxides, for example, such as a mixture of iron, manganese and zinc oxides. This material has relatively low losses at the operating frequency of the system and has high permeability when it is not saturated with magnetic flux. Each of the core portions 148, 150 and 152 has a slot through which its signal winding is wound. The core portion 148 carries the signal winding 18 of the discriminator 10 and this winding is formed in two portions each wound through the slot and around opposite edge portions of the core portion 148. The two parts of the winding 18 are connected in series and the turns are wound in such direction that any flux generated by the signal winding 18 flows in a closed loop around the slot through which the winding is wound. It is not essential to use a slotted member for the core portion 148, but such a winding arrangement is helpful in eliminating coupling between the signal circuits.

When the control winding 144 is not energized, the core portion 148 has maximum permeability and accordingly, the signal winding 18 has maximum inductance. As the D.-C. current through the winding 144 is increased, the magnetic saturation of the core 148 is increased, thus reducing the effective inductance of the winding 18. In normal operation, a bias current will be established through the winding 144 of such magnitude that the inductance of the winding 18 is near the midportion of its range, and the inductance of the winding 18 will be changed in accordance with the requirements of the system by increasing or decreasing the current through the winding 144. In practice the plate current of the final tube in the D.-C. amplifier 12 can be arranged to provide the necessary bias current in the winding 144.

Another signal winding 20 is wound in the same manner on a separate ferrite core portion 150, and is connected into the antenna circuit of the receiver as shown in Figure 1. A fixed capacitor 154 is connected in parallel with the signal winding 20 to form a tuned radio-frequency circuit which is resonant at the frequency of the station to be received. One terminal of this tuned circuit is connected to the antenna lead, as indicated diagrammatically at 156, and to the control grid 158 of an R-F amplifier tube 160. The other terminal of this tuned circuit is connected through a fixed capacitor 162 to the common ground circuit. The cathode 164 and suppressor grid 166 of this tube are connected to the common ground circuit. Automatic volume control of the signal is provided by a lead 168 which is connected through the signal winding 120 to the grid 158.

The anode 170 of the radio-frequency amplifier tube 160, is coupled through the signal winding 22 and an isolating resistor 172 to the positive voltage supply lead 62. The screen grid 174 of this tube is by-passed to ground by means of a capacitor 176 and is connected to the junction of the resistor 172 and the signal winding 22.

The winding 22 forms a tuned R-F circuit with a fixed capacitor 178 which is connected between the anode 170 of the R-F tube 160 and the cathode 60 of the oscillator tube 58. The cathode 76 is at a low impedance point with respect to the common ground circuit, so that, so far as inter-stage tuning is concerned, the capacitor 178 can be considered to be connected in parallel with the signal winding 22. The capacitor 178 is returned to the cathode 76 in order to feed the oscillator signal into the mixer stage 8 through the coupling capacitor 180 which is connected to the control grid 182 of the mixer tube 184, a D.-C. return circuit being provided through a resistor 186. The cathode 188 of this tube is connected to ground through a fixed resistor 190 connected in parallel with a capacitor 192. The anode 194 of this tube is connected to the intermediate frequency amplifier 26 in conventional manner.

In operation, assume the switch 48 to be closed in order to tune the receiver to a new station, and assume the frequency of this station to be higher than the frequency of the station to which the receiver was previously tuned. The closing of the switch 48 will cause the oscillator 4 to generate a signal which is at a frequency approximately equal to the series resonant frequency of the inductor 40 and the capacitor 34. This signal is applied to the discriminator circuit 10 and will be above the resonant frequency of the frequency-sensitive network formed by the signal winding 18, the two padding inductors 114 and 118, and the capacitor 116. Accordingly, a higher alternating voltage will be developed across the inductive portion of this frequency-selective network than across the capacitor 116. Accordingly, the negative voltage produced by this network will be greater than the D.-C. voltage produced from the second rectifier 132 and accordingly, a negative control voltage will be applied to the input terminal 136 of the D.-C. amplifier. This negative control voltage at the terminal 136 is arranged to increase the current flowing through the control winding 144 of the controllable inductor 16 and thereby increase the extent of magnetic saturation in its core. This increased flux through the ferrite portion 148 of the core decreases the effective inductance of the signal winding 18 and increases the resonant frequency of the frequency-selective circuit of which the winding 18 forms a part until this series circuit is again resonant at the applied frequency.

The increase in flux in the core 146, which caused a lowering of the effective inductance of the winding 18, also produced a corresponding change in the inductance of the signal windings 20 and 22 so that the circuits incorporating these signal windings are automatically tuned to the new frequency.

The padding inductors 114 and 118 are included in the frequency-sensitive network because the frequency of this network operates over a different range from the tuned circuits incorporating the signal windings 20 and 22. For example, in a superheterodyne receiver, the frequency of the local oscillator is above or below the frequency of the station to which the receiver is tuned by an amount equal to the center frequency of the intermediate-frequency amplifier circuits. Ordinarily, the local oscillator is tuned to a frequency higher than the signal which is to be received. For example, in a broadcast receiver having a 250 kilocycle intermediate frequency and which is arranged to cover a frequency range between 550 kilocycles to 1650 kilocycles, the oscillator frequency will cover a range from 800 to 1900 kilocycles. Thus the radio-frequency circuits formed by the signal inductor 20 and the inductor 22 are tunable over a three-to-one range, but the local oscillator is tunable over a two-to-one range. In order to affect these tuning ranges, it is necessary for the radio-frequency signal windings 20 and 22 to each tune over an inductance range of 9–1 while the oscillator is tuning over a range of 4–1, and to maintain the constant difference of 250 kilocycles between the resonant frequency of the frequency-sensitive circuit including the winding 18 and the two radio-frequency circuits formed by the signal windings 20 and 22. For this reason, the fixed padding inductors 118 and 114 are connected with the signal winding 18 as shown in the drawing. That is, the inductance of the signal winding itself actually varies over a 9–1 range, whereas the total inductance of the network formed by the inductor 18 in combination with the fixed padding inductors 114 and 118 varies over the desired 4–1 inductance range. By this means the receiver "tracks" throughout its operating range. A further discussion in connection with the calculation of values of the inductances for tracking such circuits will be found in the co-pending application of Carl G. Sontheimer, filed July 22, 1954, Serial Number 445,146.

Figure 3:
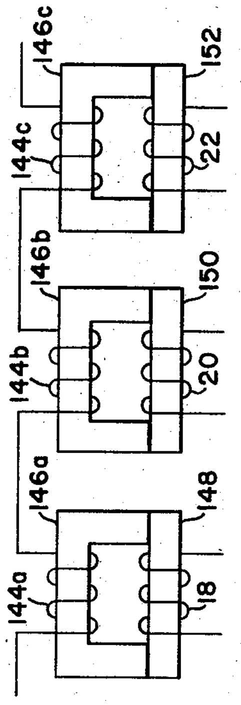
Figure 3 represents diagrammatically three separate controllable inductors in an arrangement suitable for substitution for the inductor shown in Figure 2.

Figure 3 shows another controllable inductor arrangement, in which three separate cores of powdered iron or other material are used, indicated respectively at *146a*, *146b*, and *146c*. The control winding means 144 is divided into three winding portions indicated respectively at *144a*, *144b*, and *144c*, each wound around the corresponding portion of the core 146. The core *146a* carries the ferrite bar 148 around which is positioned the winding 18. In this example, because the individual core portions can be physically isolated and shielded from each other, the signal winding 18 is not formed in two sections, but is merely wound around the ferrite bar 148. The core *146b* carries the ferrite bar 150 around which is positioned the signal winding 20, and the core *146c* carries the ferrite bar 152 with its signal winding 22.

Figure 4 shows a receiver arrangement in block-diagram form in which numerals corresponding to those used in connection with Figures 1, 2, and 3 indicate similar circuit arrangements. In this example, the tuning unit 2 is formed integrally with a local oscillator 4 and the entire oscillator assembly is positioned remotely from the receiver proper. In this example, the isolation circuit 6 is positioned adjacent the local oscillator for convenience, in order to provide a low impedance circuit connection between the isolation circuit and the self-zeroing discriminator 10, thereby reducing the possibility of the pick-up of extraneous signals. If desired, the isolation circuit can be located with the main portion of the receiver and only the local oscillator positioned at the remote point.

With this arrangement, any type of generally stable local oscillator may be employed or the oscillator illustrated in connection with Figure 1 may be used. The remainder of the receiver operates in the same manner as the one illustrated in connection with Figure 1.

From the foregoing it will be seen that I have provided a radio-receiver that may be conveniently controlled from remote positions without the necessity of mechanical coupling between the tuning unit and the remainder of the receiver and which can be readily constructed from available components.

The controllable inductor utilized in the receiver arrangement may be of the type described in U.S. patent application Serial No. 425,244, filed April 23, 1954, entitled "Magnetic Apparatus" by Carl G. Sontheimer, now Patent No. 2,869,087 and in U.S. patent application Serial No. 213,548, filed March 2, 1951 by Gerhard H. De Witz.

I claim:

1. A radio receiver of the superheterodyne type having a mixer stage, an oscillator coupled to said mixer stage, a frequency-selective network forming part of said oscillator and positioned remotely from the remainder thereof, manually controllable tuning means arranged to control the frequency selective characteristics of said remotely positioned network, control-signal generating means coupled to said oscillator, said control-signal generating means including a first electrically-controllable inductor, said control-signal generating means being arranged to produce a control signal dependent jointly upon the frequency of the signal generated by said oscillator and upon the inductance of said first inductor, and a station-selecting tuned circuit including a second electrically-controlled inductor, both said first and second electrically-controllable inductors being under the control of said control signal.

2. A radio receiver of the superheterodyne type having a mixer stage, an oscillator coupled to said mixer stage, control means for changing said oscillator frequency electrically-controllable inductance means having magnetically permeable and saturable core means and control winding means for controlling the amount of saturation of said core means and first and second separate signal windings associated with said core means, the inductance values of said signal windings varying in response to changes in the amounts of saturation of said core means, a self-zeroing frequency selective discriminator circuit coupled to said oscillator and including rectification means for producing an output signal, said discriminator circuit including said first signal winding, the frequency selection of said discriminator circuit being controlled by the inductance value of said first signal winding, the output signal produced by said discriminator circuit being dependent jointly upon the frequency of the signal generated by said oscillator and the inductance value of said first signal winding, a tuned radio-frequency circuit having its output connected to said mixer stage and including said second signal winding, the tuning of said radio-frequency circuit being tuned by said second signal winding, and means coupling the output signal from said rectification means of said discriminator to said control winding means for controlling the inductance values of said first and second signal windings.

3. A radio receiver of the superheterodyne type including a radio frequency amplifier portion having at least two tunable resonant circuits, a mixer stage coupled to said radio frequency amplifier portion, an IF amplifier portion coupled to said mixer stage, a detector stage coupled to the output of said IF amplifier stage, an audio amplifier coupled to the said detector stage, a loudspeaker connected to said audio amplifier, a variable frequency oscillator including means for changing the frequency of said oscillator, means coupling said oscillator to said mixer stage, a self-zeroing discriminator coupled to said oscillator, a D.-C. amplifier connected to the output of said detector, and an electrically controllable inductor having a core of ferromagnetic material, a control winding, and first, second, and third signal windings arranged so that the inductance of each of said signal windings varies in accordance with the current through said control winding, said control winding being connected to said D.-C. amplifier, said first signal winding forming a portion of said self-zeroing discriminator and being arranged to control the frequency selective characteristics of said discriminator, and said second and third signal windings forming portions respectively of said resonant circuits to control the station selecting characteristics of said radio receiver.

4. A radio receiver of the superheterodyne type including a radio frequency amplifier portion having at least two tunable resonant circuits, a mixer stage coupled to said radio frequency amplifier portion, an IF amplifier portion coupled to said mixer stage a detector stage coupled to the output of said IF amplifier stage, an audio amplifier coupled to the said detector stage, a loudspeaker connected to said audio amplifier, a variable frequency oscillator, a pair of conductors connected at one end to said oscillator, inductance means and a capacitance means connected in series between said pair of conductors at the other end, the frequency of said oscillator being controlled by the impedance between said conductors, and said oscillator generating a frequency at which said inductance and capacitance means are series resonant, control means to change the series resonant frequency of said inductance and capacitance means, means coupling said oscillator to said mixer stage, a self-zeroing discriminator coupled to said oscillator, a D.-C. amplifier connected to the output of said discriminator, and an electrically controllable inductor having a core of ferromagnetic material, a control winding, and first, second, and third signal windings arranged so that the inductance of each of said signal windings varies in accordance with the current through said control winding, said control winding being connected to said D.-C. amplifier, said first signal winding forming a portion of said self-zeroing discriminator and being arranged to control the frequency selective characteristics of said discriminator, and said second and third signal windings forming portions respectively of said resonant circuits to control the station selecting characteristics of said radio receiver.

5. A radio receiver of the superheterodyne type having a radio frequency amplifier stage and a mixer stage, an oscillator coupled to said mixer stage, manually actuable means for tuning the frequency of said oscillator, a tunable frequency discriminator having its input coupled to said oscillator, said tunable discriminator including a controllable inductance element having magnetically saturable core means for controlling the frequency response characteristics of said discriminator, control winding means for regulating the saturation of said core means, circuit means connecting said control winding means to the output of said discriminator, and a plurality of controllable inductance elements in said radio frequency stage having magnetically saturable core means for tuning the frequency of said radio frequency amplifier stage, said control winding means also regulating the saturation of said latter core means for tuning said radio frequency amplifier stage in accordance with the tuning of said oscillator.

6. A radio receiver tuning system comprising an oscillator, a tunable discriminator coupled to said oscillator, manually actuable means for tuning the frequency of the oscillator, and arranged to produce a control signal, electrically controllable inductor means having magnetizable core means, control winding means for regulating the magnetic saturation of said core means, and at least two signal windings whose inductance is controlled by the magnetic saturation of said core means, one of said signal windings forming part of said discriminator for tuning the frequency response of said discriminator, a resonant station-selecting circuit including another of said signal windings, said control winding means having circuit means coupling said control signal to said control winding means, whereby the inductance of said signal windings is under the control of said control signal and arranged to change the resonant frequency of said station-selecting circuit in unison with said oscillator.

7. A radio receiver of the superheterodyne type having a radio frequency amplifier stage and a mixer stage, an oscillator coupled to said mixer stage, control means for tuning the frequency of said oscillator including a frequency-selective network having series-connected inductance and capacitance elements, said frequency-selective network forming part of said oscillator and being positioned remotely therefrom, circuit means connecting said network to said oscillator, a tunable frequency discriminator having its input coupled to said oscillator, said tunable discriminator including a controllable inductance element having magnetically saturable core means for controlling the frequency response characteristics of said discriminator, control winding means for regulating the saturation of said core means, circuit means connecting said control winding means to the output of said discriminator, and a plurality of controllable inductance elements in said radio frequency stage having magnetically saturable core means for tuning the frequency of said radio frequency amplifier stage, said control winding means also regulating the saturation of said latter core means for tuning said radio frequency amplifier stage in accordance with the tuning of said oscillator.

8. A radio receiver of the superheterodyne type including a radio frequency amplifier portion having at least two tunable resonant circuits, a mixer stage coupled to said radio frequency amplifier portion, an IF amplifier portion coupled to said mixer stage, a detector stage coupled to the output of said IF amplifier stage, an audio amplifier circuit coupled to the said detector stage, a variable frequency oscillator including means for changing the frequency of said oscillator, means coupling said oscillator to said mixer stage, a self-zeroing discriminator coupled to said oscillator, a D.-C. amplifier connected to the output of said discriminator, and electrically controllable inductance apparatus including core means of ferromagnetic material, control winding means for controlling the amounts of magnetic saturation of said core means, and first, second, and third signal windings arranged so that the inductances of said signal windings varies in accordance with the amounts of saturation of said core means, said control winding means being connected to said D.-C. amplifier, said first signal winding forming a portion of said self-zeroing discriminator and being arranged to control the frequency selective characteristics of said discriminator, and said second and third signal windings forming portions respectively of said resonant circuits to control the station selecting characteristics of said radio receiver.

9. A radio receiver of the superheterodyne type including a radio frequency amplifier portion having at least two tunable resonant circuits, a mixer stage coupled to said radio frequency amplifier portion, an IF amplifier portion coupled to said mixer stage a detector stage coupled to the output of said IF amplifier stage, and an audio amplifier circuit coupled to the said detector stage, a variable frequency oscillator, a pair of electrical conductor means connected at one end to said oscillator and extending therefrom to a remote position, inductance means and a capacitance means at said remote position connected in series across said pair of conductor means, the frequency of said oscillator being controlled by the impedance across said pair of conductor means, and said oscillator generating a frequency at which said inductance and capacitance means are series resonant, control means to change the series-resonant frequency of said inductance and capacitance means, means coupling said oscillator to said mixer stage, a self-zeroing discriminator coupled to said oscillator, and electrically controllable inductor apparatus including core means of ferromagnetic material, control winding means for regulating the amounts of magnetic saturation of said core means, and first, second, and third signal windings arranged so that the inductances of each of said signal windings varied in accordance with changes in the amounts of magnetic saturation of said core means, said first signal winding forming a portion of said self-zeroing discriminator and being arranged to control the frequency selective characteristics of said discriminator, and said second and third signal windings forming portions respectively of said resonant circuits to control the station selecting characteristics of said radio receiver.

References Cited in the file of this patent

UNITED STATES PATENTS

| | | |
|---|---|---|
| 1,833,986 | Christoffel | Dec. 1, 1931 |
| 2,415,469 | Webb | Feb. 11, 1947 |
| 2,464,193 | Wild | Mar. 8, 1949 |
| 2,490,591 | Himmer | Dec. 6, 1949 |
| 2,541,329 | Boosman et al. | Feb. 13, 1951 |
| 2,581,202 | Post | Jan. 1, 1952 |